United States Patent
Gathman et al.

(10) Patent No.: US 10,014,845 B2
(45) Date of Patent: Jul. 3, 2018

(54) SYSTEMS AND METHODS PROVIDING AN INTERMODULATION DISTORTION SINK

(71) Applicant: QUALCOMM INCORPORATED, San Diego, CA (US)

(72) Inventors: Timothy Donald Gathman, San Diego, CA (US); Chirag Dipak Patel, San Diego, CA (US); Sasha Vujcic, San Diego, CA (US); Aleksandar Miodrag Tasic, San Diego, CA (US); Wu-Hsin Chen, San Diego, CA (US); Klaas van Zalinge, La Jolla, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/472,055

(22) Filed: Mar. 28, 2017

(65) Prior Publication Data

US 2018/0048294 A1    Feb. 15, 2018

Related U.S. Application Data

(60) Provisional application No. 62/438,171, filed on Dec. 22, 2016, provisional application No. 62/372,719, filed on Aug. 9, 2016.

(51) Int. Cl.
| | |
|---|---|
| *H04B 1/10* | (2006.01) |
| *H03H 11/32* | (2006.01) |
| *H03F 3/19* | (2006.01) |
| *H03F 3/21* | (2006.01) |

(Continued)

(52) U.S. Cl.
CPC ............... *H03H 11/32* (2013.01); *H03F 3/19* (2013.01); *H03F 3/21* (2013.01); *H03F 3/45475* (2013.01); *H04L 7/0337* (2013.01); *H03F 2200/06* (2013.01); *H03F 2200/09* (2013.01);

(Continued)

(58) Field of Classification Search
CPC ........ H03H 11/32; H03H 7/42; H03H 7/0337; H03F 2200/06; H03F 1/223; H03F 2200/09; H03F 2203/45291; H03F 3/45766; H03F 3/45475; H03F 3/21; H03F 3/19;

(Continued)

(56) References Cited

U.S. PATENT DOCUMENTS

| | | | |
|---|---|---|---|
| 7,035,616 | B2 | 4/2006 | Reynolds |
| 8,130,039 | B2 | 3/2012 | Dishop |
| 8,222,947 | B2 | 7/2012 | Kan et al. |

(Continued)

OTHER PUBLICATIONS

International Search Report and Written Opinion—PCT/US2017/042395—ISA/EPO—dated Oct. 24, 2017.

(Continued)

*Primary Examiner* — Rahel Guarino
(74) *Attorney, Agent, or Firm* — Haynes and Boone, LLP

(57) ABSTRACT

A circuit includes an active balun having an RF signal input and having differential signal outputs, the active balun including a first pair of transistors coupled to the RF signal input, the first pair of transistors including a first transistor of a first type and a second transistor of a second type, wherein the first type and second type are complementary; and an intermodulation distortion (IMD) sink circuit having an operational amplifier (op amp) coupled between a first node and a second node, wherein the first transistor and second transistor are coupled in series between the first node and the second node.

29 Claims, 11 Drawing Sheets

(51) Int. Cl.
*H03F 3/45* (2006.01)
*H04L 7/033* (2006.01)

(52) U.S. Cl.
CPC .. *H03F 2200/294* (2013.01); *H03F 2200/451* (2013.01); *H03F 2203/45116* (2013.01)

(58) Field of Classification Search
CPC ......... H03F 2200/451; H03F 2200/294; H03F 2203/45116; H03G 1/0029
See application file for complete search history.

(56) References Cited

U.S. PATENT DOCUMENTS

| | | | |
|---|---|---|---|
| 9,281,787 B2 | 3/2016 | Issakov | |
| 2002/0098820 A1 | 7/2002 | Dijkmans et al. | |
| 2002/0105360 A1* | 8/2002 | Kim | H03D 7/1441 327/65 |
| 2009/0212872 A1* | 8/2009 | Chang | H03F 3/195 330/301 |
| 2009/0289715 A1 | 11/2009 | Sengupta et al. | |
| 2014/0354358 A1 | 12/2014 | Kim et al. | |
| 2016/0126921 A1 | 5/2016 | Hur et al. | |

OTHER PUBLICATIONS

Kulkarni R., et al., "UHF Receiver Front-End: Implementation and Analog Baseband Design Considerations", IEEE Transactions on Very Large Scale Integration (VLSI) Systems, IEEE Service Center, Piscataway, NJ, USA, vol. 20, No. 2, Feb. 1, 2012, pp. 197-210, XP011397571, ISSN: 1063-8210, DOI: 10.1109/TVLSI.2010.2096438.

Saeedi S., et al., "Second and Third-Order Distortion Suppression Technique for Noise Canceling CMOS LNAs", IEICE Electronics Express, vol. 6, No. 13, Jan. 1, 2009, pp. 959-965, XP055415919, DOI: 10.1587/elex.6.959.

Subramaniyan H.K., et al., "RF Transconductor Linearization Robust to Process, Voltage and Temperature Variations", IEEE Asian Solid-State Circuits Conference (A-SSCC), Nov. 10, 2014, pp. 333-336, XP032719778, DOI: 10.1109/ASSCC.2014.7008928, ISBN: 978-1-4 799-4090-5, [retrieved on Jan. 13, 2015].

Subramaniyan H.K., et al., "RF Transconductor Linearization Robust to Process, Voltage and Temperature Variations", IEEE Journal of Solid-State Circuits, IEEE Service Center, Piscataway, NJ, USA, vol. 50, No. 11, Nov. 1, 2015, pp. 2591-2602, XP011588342, ISSN: 0018-9200, DOI: 10.1109/JSSC.2015.2453964 [retrieved on Oct. 27, 2015].

\* cited by examiner

SYSTEMS AND METHODS PROVIDING AN INTERMODULATION DISTORTION SINK

CROSS-REFERENCE TO RELATED APPLICATIONS

The present application claims the benefit of U.S. Provisional Patent Application No. 62/372,719, filed Aug. 9, 2016, and entitled "Systems and Methods Providing an Intermodulation Distortion Sink," and of U.S. Provisional Patent Application No. 62/438,171, filed Dec. 22, 2016, and entitled "Systems and Methods Providing an Intermodulation Distortion Sink," the disclosures of which are incorporated by reference herein in their entirety.

TECHNICAL FIELD

This application relates to radio frequency (RF) receivers, and more particularly, to RF receivers implementing an intermodulation distortion (IMD) sink with an active balun.

BACKGROUND

Some conventional radio frequency (RF) transceivers include a full duplex functionality, allowing RF transmission simultaneously with RF reception, although at different frequencies. Focusing on the receive side, one example conventional RF receiver receives an RF signal over the air and passes the RF signal to a low noise amplifier (LNA). The output of the LNA may be passed to a transformer. In other words, the RF signal may be received as a single-ended signal, and the transformer creates a differential signal to pass to a mixer. The mixer then down converts the RF signal to a baseband signal. The receive side then performs further amplification, filtering, and digital conversion. A potential drawback of such a circuit is that the transformer may be relatively narrow-band because it may include capacitive and inductive components tuned to a particular target frequency. Operation outside of the relatively narrow band around the target frequency and/or implementing tuning over a wide bandwidth may cause unacceptable loss of performance. Another potential drawback of such a circuit is that its poor reverse isolation prevents a single LNA from directly driving two or more transformers and downconverter paths in carrier aggregation architectures. Isolation between downconverters in carrier aggregation receive architectures is necessary such that intermodulation products from jammers and two or more local oscillators do not corrupt the received signal. Furthermore, it may be difficult and expensive to implement coupled inductors of the transformer on a semiconductor chip.

Another conventional RF receiver uses active baluns to create the differential signals. Generally, active baluns do not have the narrow-band limitations of conventional transformers because they may be implemented using transistors and may omit or significantly reduce the use of capacitive or inductive components. However, active baluns are nonlinear devices that may experience intermodulation distortion (IMD). Specifically, active baluns experience second-order and third-order IMD, where some of those IMD components may fall within the receive signal band and make it difficult to recover the received signal. Specifically, in a full-duplex transceiver, some of the energy of the transmitted signal may inevitably find its way into the receiver. Third-order IMD of that transmitted signal and undesired signals adjacent to the receive channel may include frequencies that fall within the receive signal band. In other words, third order IMD may cause distortion that, unless reduced or prevented, degrades the received signal.

Accordingly, there is a need in the art for an RF receive circuit with a relatively wide band of operation and relatively low susceptibility to IMD.

SUMMARY

According to one embodiment, a circuit includes: an active balun having an RF signal input and having differential signal outputs, the active balun including a first pair of transistors coupled to the RF signal input, the first pair of transistors including a first transistor of a first type and a second transistor of a second type, wherein the first type and second type are complementary; and an intermodulation distortion (IMD) sink circuit having an operational amplifier (op amp) coupled between a first node and a second node, wherein the first transistor and second transistor are coupled in series between the first node and the second node.

According to another embodiment, a method includes: receiving a single-ended RF signal at an active balun, the active balun including a first transistor of a first type and a second transistor of a second type coupled in series between a first node and a second node, the first type and second type being complementary, wherein the single-ended RF signal is received at a gate of the first transistor and at a gate of the second transistor; converting the single-ended RF signal to a differential signal by the active balun; and during the converting, reducing second-order intermodulation distortion (IMD) signals by a IMD sink circuit coupled with the first node and the second node.

According to another embodiment, a radio frequency (RF) receiver includes: means for converting a single-ended RF signal to a differential signal, wherein the means for converting include a first transistor of a first type and a second transistor of a second type coupled in series with a first node and a second node, the first and second types being complementary; and means for reducing intermodulation distortion (IMD) signals at the first node and the second node.

According to yet another embodiment, a circuit includes: an active balun including: a first transistor of a first type and a second transistor of a second type coupled in series between a first node and a second node, the first type and the second type being complementary; a third transistor of the first type and a fourth transistor of the second type coupled in series between the first node and the second node; a first current source coupled between the first node and a power supply; a second current source coupled between the second node and ground; a radio frequency (RF) input configured to receive an RF signal at a gate of the first transistor and a gate of the second transistor; a first differential signal output coupled to a drain of the first transistor and a drain of the second transistor; and a second differential signal output coupled to a drain of the third transistor and a drain of the fourth transistor; and an intermodulation distortion (IMD) sink circuit coupled with the active balun and having: a first capacitor coupled with the first node and the second node; and an operational amplifier (op amp) configured to receive a first component of an IMD signal and a second component of the IMD signal and to generate a difference signal in response thereto.

DESCRIPTION

Figure 1:
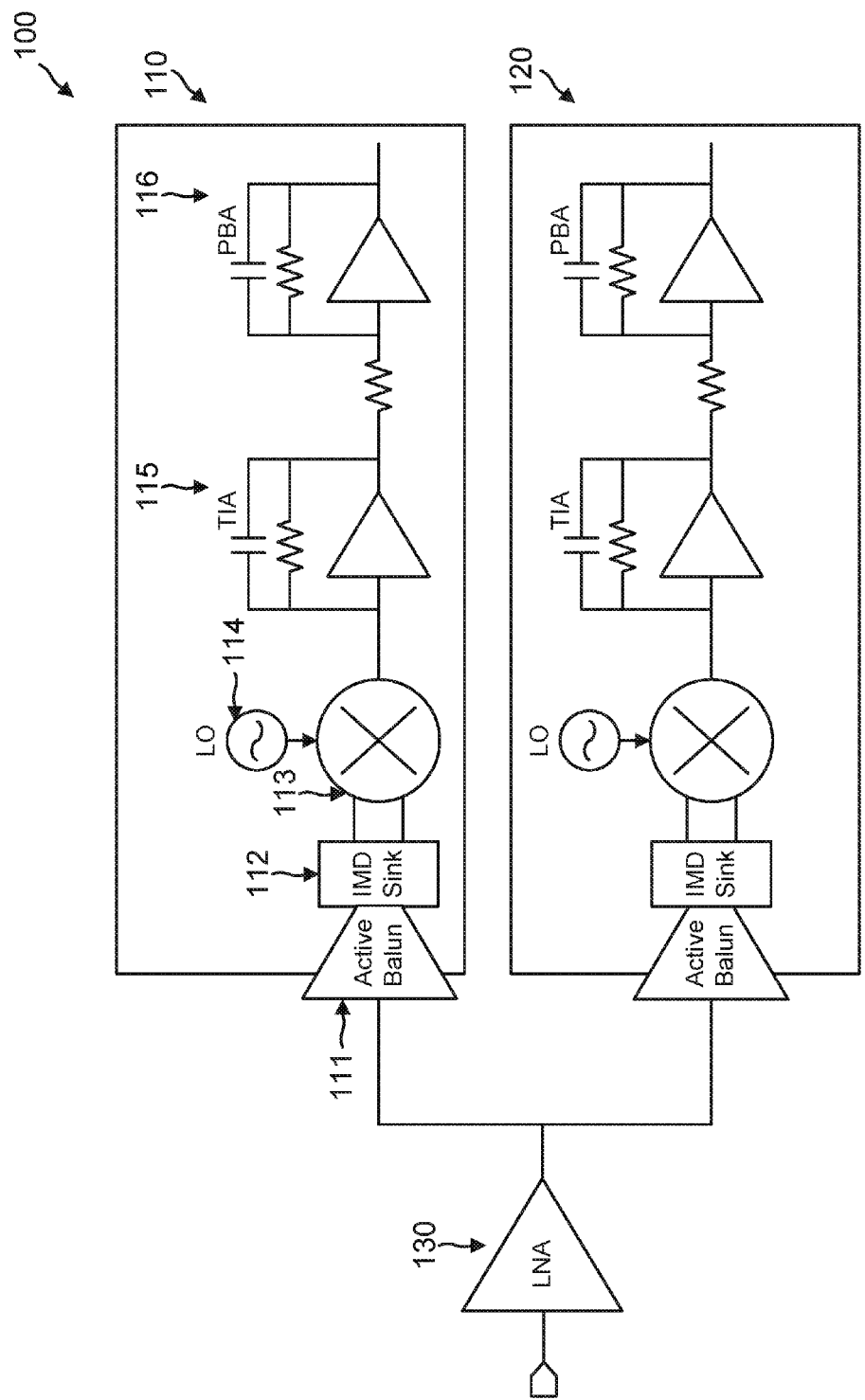
FIG. 1 illustrates an example RF receiver in accordance with an embodiment of the disclosure.

Various embodiments include a receiver having an active balun with an IMD sink circuit. The active balun converts the single-ended signal to a differential signal, and the IMD sink circuit reduces even-order and odd-order IMD. Accordingly, various embodiments may provide transistor-based active baluns for use in applications having relatively low tolerance for distortion while at the same time reducing or minimizing the use of narrowband or area-intensive components, such as inductive components.

In one embodiment, the active balun includes p-channel MOSFET (PMOS) transistors and n-channel MOSFET (NMOS) transistors coupled in series with a biasing current source to generate the differential signal. The PMOS transistors may be coupled to a first node and the NMOS transistors may be coupled to a second node. Continuing with the example, second-order IMD components may be 180° out of phase with each other on the first node versus the second node. The IMD sink circuit includes a capacitor to remove higher-frequency second-order IMD. As explained further below, a capacitor may be chosen so that it acts as a short circuit for the higher-frequency signals. The capacitor may be arranged between the first node coupled with the PMOS transistors and the second node coupled with the NMOS transistors, and the phase shift along with the short cancels out the higher-frequency components of the second-order IMD.

The IMD sink circuit also includes active circuitry to remove the lower-frequency components of the second-order IMD. For instance, in one embodiment an operational amplifier (op amp) may be in communication with a bias circuit to remove a DC bias of the active balun. The op amp compares the plus and minus components of the IMD signals and outputs a signal equal to a difference thereto. The signal output from the op amp controls a gate of a transistor that couples the first and second nodes. Thus, the op amp output is coupled to the inverting and noninverting inputs through the transistor, which creates a feedback structure to equalize the signal levels at the inverting and noninverting inputs. Such feedback may cancel the second-order IMD.

In another example, the IMD sink circuit includes a four-input op amp receiving the plus and minus components appearing on the first and second nodes as well as a voltage corresponding to a DC bias of the active balun. The op amp itself then effectively cancels the second-order IMD signal components while ignoring the DC bias. The op amp outputs a difference signal to control a gate of a transistor. Once again, the transistor may be coupled with the inverting and noninverting inputs of the op amp to cancel second-order IMD.

In another example, the circuit may include capacitors coupling gates of transistors acting as current sources in the active balun. The capacitors may be coupled with one component of the differential signal. The capacitors appear as shorts to the high-frequency, AC components of the differential RF signal, thereby applying a component of the differential signal to the gates of the transistors. This controls the current source to either increase or decrease current through the active balun in accordance with the RF signal, thereby correcting for phase and amplitude imbalance of the active balun to provide a fully balanced differential output signal.

Another example embodiment includes a method. The method includes receiving an RF signal at an active balun, converting the single-ended RF signal to a differential RF signal, and reducing second-order IMD signals from the differential signal during the converting. Further processing may convert the differential RF signal to a baseband signal, filtering and amplifying, analog-to-digital conversion, and the like.

FIG. 1 is an illustration of example carrier aggregation receiver circuitry 100, adapted according to one embodiment. An RF signal may be received by circuitry 100 at low noise amplifier (LNA) 130. LNA 130 provides an appropriate amount of gain to the received RF signal and passes that signal to differential circuitry 110 and 120. In this example, differential circuitry 110 and differential circuitry 120 may be substantially similar and operate in a similar manner but with local oscillators (LOs) that may operate at different frequencies as in a carrier aggregation receive architecture. For ease of illustration, FIG. 1 is described with respect to differential circuitry 110, and it is understood that the description applies equally well to differential circuitry 120. Example receiver circuitry 100 includes differential circuitry 110 and 120 in order to provide operation on two different channels, where each channel has a different operating frequency within an operating band. Of course, various embodiments may use any appropriate number of channels, where each channel would correspond to a set of differential circuitry. In some embodiments the LNA 130 may be omitted and the active balun 111 may be the first element in a receive chain.

Active balun 111 receives the amplified RF signal and converts the amplified RF signal from a single-ended signal into a differential signal. Differential signaling includes transmitting information over two paired conductors, where the component on one conductor is complementary to the component on the other conductor. Thus, the two complementary components of a differential signal may be often referred to as plus and minus signals. Differential signaling receivers may detect the difference in the two complementary signals by using a subtractor that outputs a signal equal to the difference.

Differential signaling can be advantageous over single-ended signaling such as where a signal is referenced to ground. For instance, with single-ended signaling the transmission line may be subjected to noise such as when transistors adjacent to the transmission line switch state. A single-ended receiver can thus be fooled by the noise and make a bit error. But in differential signaling, the noise affects the plus signal and the minus signal equally (or at least close to equally), and a receiver may then omit the noise when it detects the difference between the plus and minus signals.

Active balun 111 converts the single-ended RF signal into a differential signal, and during the conversion, intermodulation distortion (IMD) sink 112 reduces or eliminates IMD components, as explained in more detail below. Active balun 111 then passes the differential signal to the mixer 113. Mixer 113 may be coupled with local oscillator 114 to down convert the differential signal to a baseband signal.

FIG. 1 illustrates the signal downstream of the mixer 113 with a single wire for ease of illustration, but it is understood that the signal may be a differential signal within differential circuitry 110. An example of a mixer that may be used as mixer 113 includes a current mode passive mixer, although various embodiments may use any appropriate mixer in differential circuitry 110 and 120. The baseband differential signal may be a current, and transimpedance amplifier (TIA) 115 converts the baseband current signal to a baseband voltage signal. Programmable baseband amplifier (PBA) 116 provides further amplification and filtering of the voltage. Other functions downstream of the PBA 116 include, but are not limited to filtering, analog to digital conversion, a modem, and other types of signal processing.

Thus, receiver circuitry 100 receives a single-ended RF signal, converts the single-ended signal into a differential signal that may then be down converted to baseband, converted to a voltage signal and amplified. Receiver circuitry 100 may be implemented in a larger system that includes a transmitter (not shown) and other upstream and downstream circuitry (also not shown). In fact, in some embodiments receiver circuitry 100 may be implemented in a full-duplex transceiver so that energy from transmitted signals may find its way to the input of low noise amplifier 130. Embodiments described herein include IMD sink 112 to reduce or eliminate IMD components, thereby helping to ensure that the energy from the transmitted signals does not interfere with the received signals. Specifically, some second-order IMD components resulting from transmitted signal energy, when applied to an active balun, might further result in third-order IMD components that may fall within a receive operating band. This is explained in more detail below with respect to FIG. 2. IMD sink 112 in the present embodiment reduces or eliminates second-order IMD components so that those second-order IMD components do not give rise to third-order IMD components.

Figure 2:
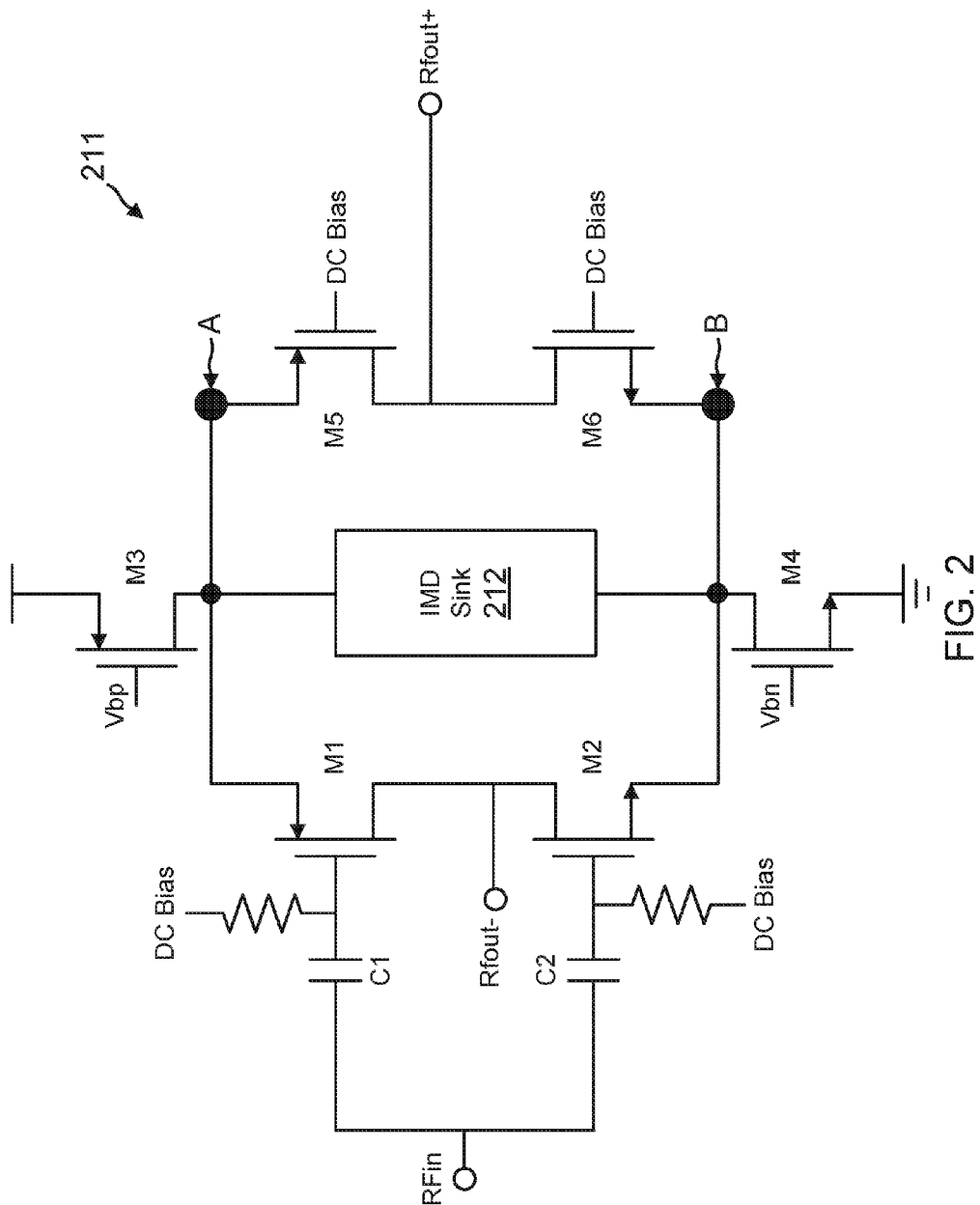
FIG. 2 illustrates an example active balun with an IMD sink circuit, according to an embodiment of the disclosure.

FIG. 2 is an illustration of example active balun 211 including example IMD sink 212, according to one embodiment. In the example of FIG. 2, active balun 211 includes transistors M1-M6 and the RF input (RFin), whereas the IMD sink 212 includes circuitry inside the rectangle coupled with the sources of transistors M1 and M2. The + component of the differential signal is indicated as Rfout+, and the − component of the differential signal is indicated as Rfout−. Rfout+ is provided at the node between the drains of transistors M5 and M6, and Rfout− is provided at the node between the drains of transistors M1 and M2.

Transistors M3 and M4 act as current sources, thereby providing a DC bias to the balun 211. M3 may be coupled with a power supply, and M4 may be coupled with ground. Of note is that transistor M3 may be a PMOS transistor, and the transistor M4 may be an NMOS transistor. Bias voltages Vbp and Vbn, in one example, may be provided by a current mirror or other relatively stable voltage source. Bias voltages Vbp and Vbn bias a PMOS and an NMOS transistor, respectively, and therefore are different with respect to each other and to the ground and power voltages so that each transistor M3 and M4 may be on during normal operation and configured to a specific DC bias. Similar DC bias may be provided to the gates of transistors M1, M5 and M2, M6 so that those transistors remain on during normal operation.

The RF input (RFin) in FIG. 2 corresponds to the output of the low noise amplifier after the split in FIG. 1. The RF signal may then be further split to be provided to the gates of transistors M1 and M2 through capacitors C1 and C2. Capacitors C1 and C2 may be chosen to have capacitance values so that they each have low impedance at the expected operating frequency (e.g., 2 GHz or other appropriate RF operating frequency).

The IMD sink 212 cancels or reduces second-order IMD components, which further reduces third-order IMD components. In an example in which artifacts of the transmitted signal may be at frequencies f1 and f2, second-order IMD components may include components at f1+f2 and f1−f2, where the first example includes a sum term and the second example includes a difference term. An example of a third order IMD component includes a signal at a frequency 2f1−f2, having a multiple of one frequency and either a sum or a difference of another frequency. The second-order IMD components in the example of FIG. 2 would be seen at nodes A and B, and the IMD sink 212 reduces or eliminates those second-order IMD components, thereby preventing or reducing the generation of third-order IMD components in the active balun itself.

Behavior of a given transistor is generally expressed by Equation 1, where i is current, v is voltage, $g_m$ is the linear transconductance term, $g_m2$ is second-order term, and $g_m3$ is third-order term. Second-order and third-order terms are nonlinearities that may correspond to second-order and third-order IMD, respectively. PMOS and NMOS transistors may have different signs for $g_m2$.

$$i = v g_m + v^2 g_m 2 + v^3 g_m 3 \qquad \text{Equation 1}$$

Figure 7:
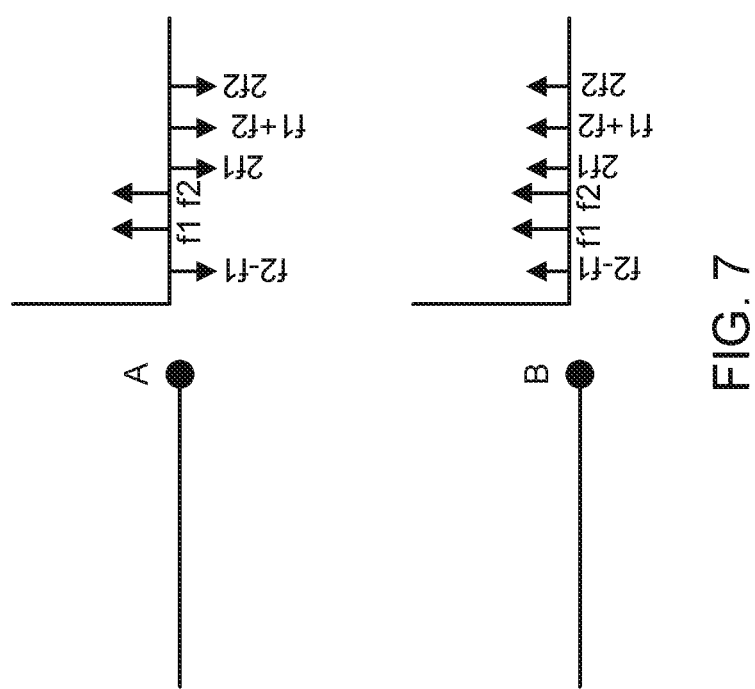
FIG. 7 is an illustration of example second-order IMD signals at the nodes A and B of the example active balun of FIGS. 2 and 5.

The structure of active balun 211 includes complementary transistors. For instance, the transistor M1 may be a PMOS transistor, whereas transistor M2 may be an NMOS transistor. Similarly, transistors M5 and M6 may be PMOS and NMOS, respectively. As explained with respect to Equation 1 above, $g_m2$ has a different sign (positive versus negative) for PMOS and NMOS transistors. Thus, due to the complimentary architecture of the active balun 211, the second-order IMD signals fed into the IMD sink 212 from transistors M1 and M2 may be 180° out of phase. This is shown at FIG. 7, which illustrates IMD signals at nodes A and B. Various embodiments take advantage of the 180° phase difference of the second-order IMD signals to cancel those second-order IMD signals.

Continuing with the example of FIG. 2, a component of the current seen at RFout− flows through M1 and M5. Nonlinearities in the interaction between M1 and M5 cause feedback third-order IMD ($g_m3$,fb) according to Equation 2 below. Similarly, a component of the current seen at RFout+ flows through transistors M2 and M6, and the nonlinearities in the interaction between M2 and M6 cause feedback third-order IMD. In Equation 2, third-order transconductance ($g_m3$) can be held to nearly zero by the DC bias at each of the transistors M1, M2, M5, and M6. However, if $g_m3$ is held to zero or nearly zero, then the feedback third-order IMD may be attributable to the second-order transconductance ($g_m2$) in the numerator in Equation 2. Therefore, holding $g_m2$ as close to zero as possible would result in a zero or nearly zero value for third-order feedback IMD. The embodiment of FIG. 2 may hold $g_m2$ as close to zero as possible by canceling it out in the IMD sink 212.

$$g_{m3,fb} = \frac{g_{m3}(1 + fg_{m1}) - 2fg_{m2}^2}{(1 + fg_{m1})^5}$$ Equation 2

Figure 3:
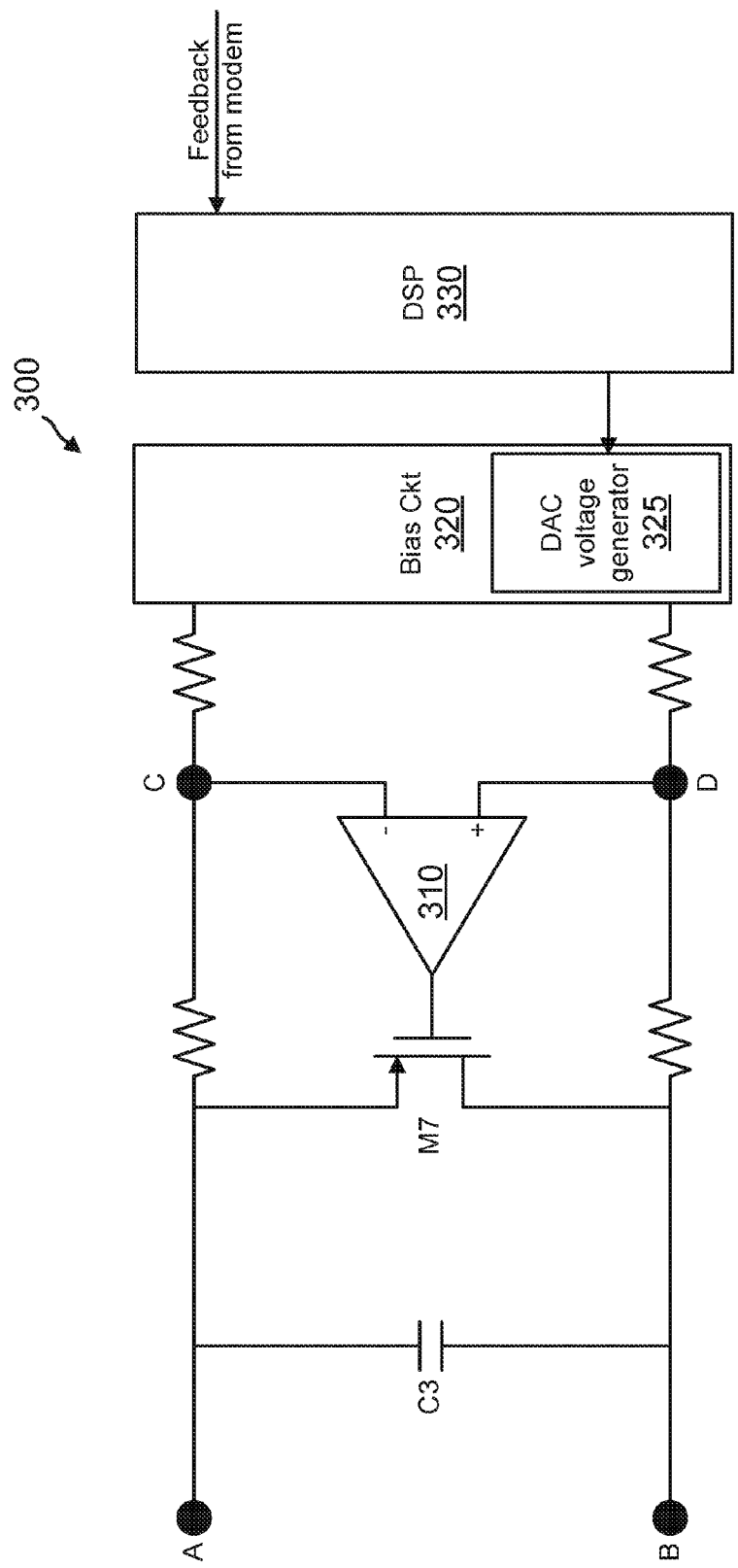
FIG. 3 illustrates an example IMD sink circuit for use with an active balun, according to one embodiment.

FIG. 3 is an illustration of an example IMD sink circuit 300, adapted according to one embodiment. For instance, IMD sink circuit 300 may be employed as circuit 112 or circuit 212 of the embodiments of FIGS. 1 and 2. With respect to the embodiment of FIG. 2, nodes A and B are labeled to show how sink circuit 300 would be coupled with the active balun 211 of FIG. 2.

As noted above, sum terms may be at relatively high frequencies (e.g., f1 plus f2). Therefore, the sum terms may be canceled or reduced by the addition of capacitor C3 coupled between nodes A and B. The capacitor C3 may be chosen to have a value so that it is substantially a short between nodes A and B at second-order sum term frequencies. The sum terms cancel due to their 180° phase difference at the short. The difference terms may be at much lower frequencies (e.g., f2 minus f1), and thus capacitor C3 may not be a short circuit at those difference term frequencies. In this example, the IMD sink circuit 300 uses active components to cancel or reduce the difference terms.

Figure 8:
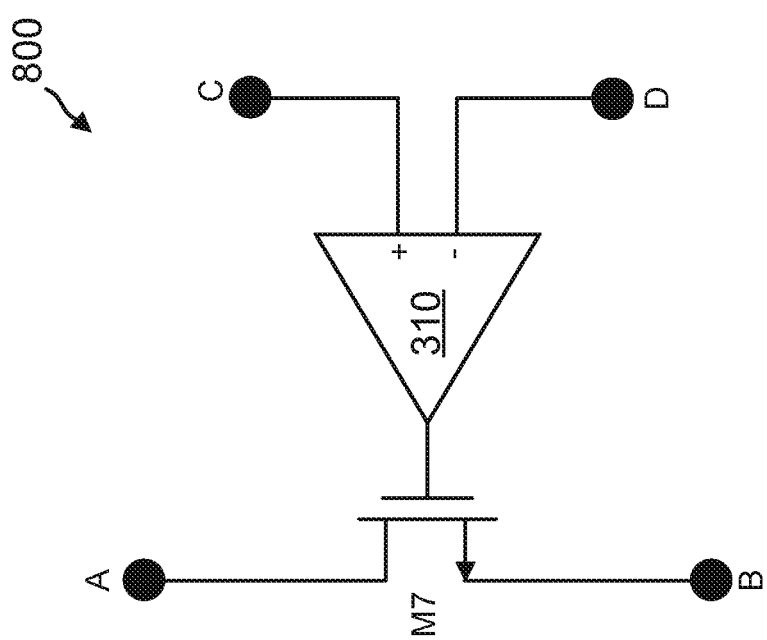
FIG. 8 is an illustration of a portion of an example IMD sink circuit, according to one embodiment.

The IMD sink 300 includes bias circuit 320. The bias circuit 320 removes a DC component of the signal between the drains of transistors M3 and M4 so that the DC component is not seen at nodes C and D. For instance, transistors M3 and M4 of FIG. 2 may be constantly biased at their gates to provide a constant or nearly constant DC bias between their drains (e.g., 1 V). The bias circuit 320 of FIG. 3 removes this DC bias so that the op-amp 310 acts upon the + and − components of the IMD signal at nodes A and B to generate a difference term. The op amp 310 applies a voltage at the gate of transistor M7 according to the difference term. Op amp 310 is arranged so that its output is coupled to nodes C and D by transistor M7 and the resistors. This arrangement may create a feedback structure that forces the values at nodes C and D to be substantially equal, thereby reducing or canceling the difference terms of the second-order distortion. FIG. 8 is an illustration of a portion of an example IMD sink circuit 800, according to one embodiment. FIG. 8 is provided to show that the embodiment of FIG. 3 may be implemented with M7 being an NMOS transistor by changing the polarity of the op amp 310. FIG. 8 shows how the transistor M7 and the op amp 310 would be coupled with the nodes A-D within the system 300 and FIG. 3.

Returning to bias circuit 320, it may include any appropriate structure that cancels the DC bias. In the example of FIG. 3, bias circuit 320 may implement a closed loop digital feedback system. Specifically, digital signal processor (DSP) 330 receives feedback from a modem (not shown) or other downstream processing device, wherein the feedback includes IMD components. The DSP 330 may then analyze the feedback signal, e.g., using a Fast Fourier Transform (FFT) or other appropriate algorithm to identify signal energy at different frequencies and to determine a level of third-order IMD. DSP 330 may then output a digital signal indicating a level of third-order IMD to DAC voltage generator 325 to cause DAC voltage generator 325 to either raise or lower its output voltage. DSP 330 may then monitor the feedback to determine whether third-order IMD has increased or decreased and may provide further iterative adjustment at DAC voltage generator 325 to minimize third-order IMD.

Figure 4:
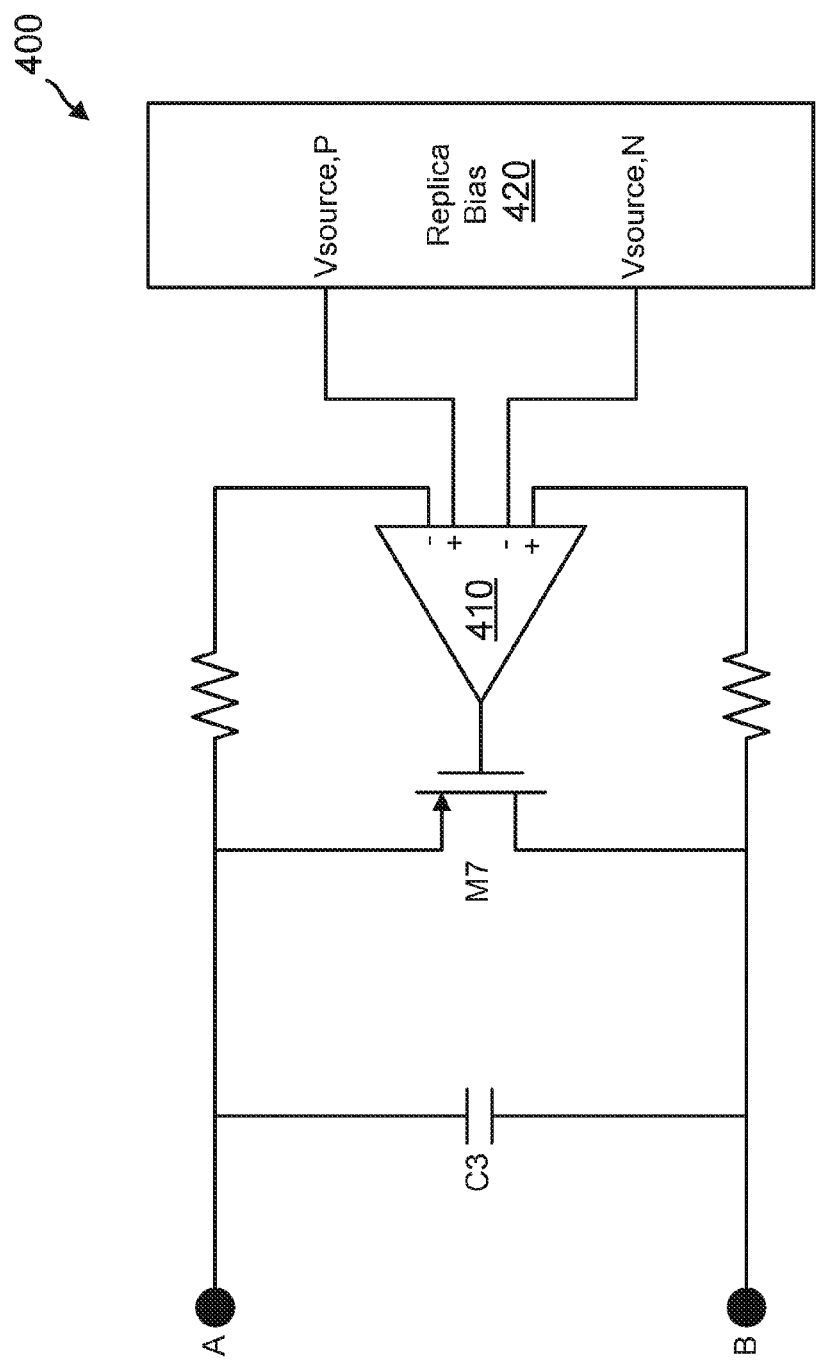
FIG. 4 illustrates an example IMD sink circuit for use with an active balun, according to one embodiment.

Another example implementation of an IMD sink is shown at FIG. 4, according to one embodiment. The IMD sink circuit 400 of FIG. 4 may be adopted for use in the embodiments of FIGS. 1 and 2 as circuit 112 or 212, where nodes A and B are illustrated to show how IMD sink circuit 400 would be coupled with active balun 211 of FIG. 2. The IMD sink circuit 400 employs capacitor C3 to cancel out second-order sum terms, as described above with respect to FIG. 3. IMD sink circuit 400 further includes op amp 410 and replica bias circuit 420 to cancel out the difference terms.

In one example, replica bias circuit 420 includes a circuit having transistors with a current and voltage ratio the same as or similar to that of transistors M1 and M2 to generate a voltage substantially the same as the voltages seen at the sources of transistors M1 and M2. Specifically, the transistors of FIG. 10 are labeled $Mx_R$ to indicate that they are replicas of the corresponding transistors labeled Mx in FIGS. 2 and 5.

Figure 10:
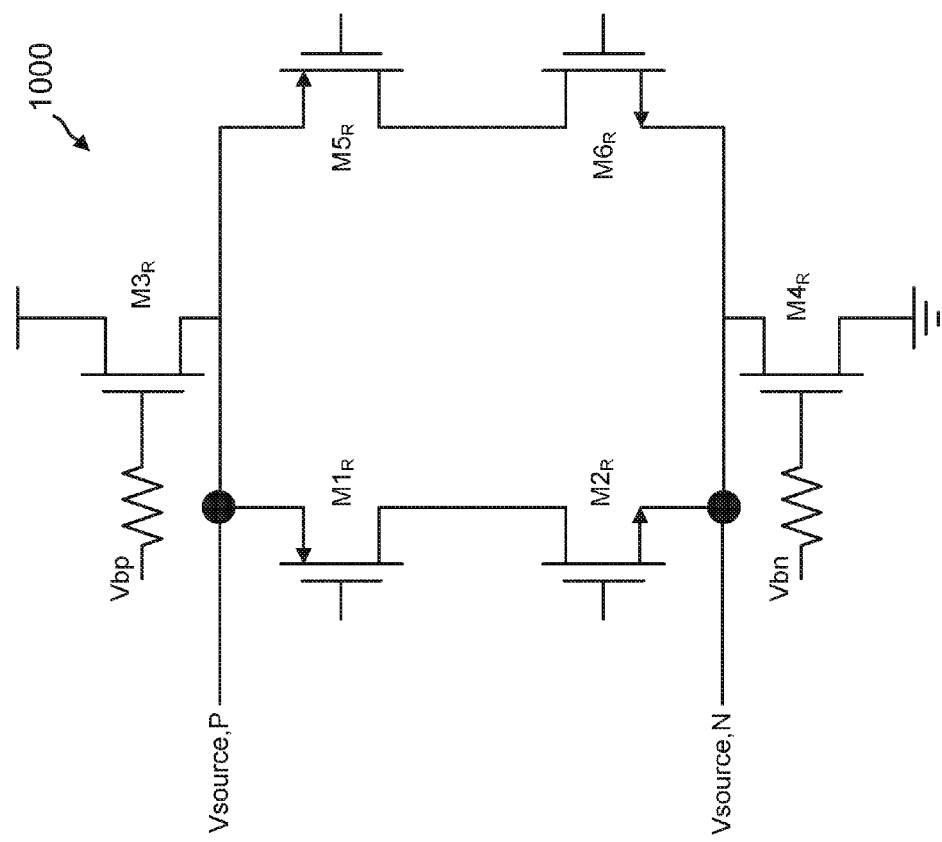
FIG. 10 is an illustration of an example replica bias circuit, according to one embodiment.

FIG. 10 is an illustration of example replica bias circuit 1000, which may be implemented in the system of FIG. 4 as replica bias circuit 420, according to one embodiment. The implementation of FIGS. 4 and 10 outputs a replica bias in this example shown by the signals Vsource,P and Vsource,N. The replica bias may be received by op amp 410, which includes four inputs, where two of the inputs receive the voltage of nodes A and B, and the other inputs received the replica bias. This may allow op amp 410 to effectively cancel out the effect of the DC bias and generate a difference signal by subtracting the − component of the IMD signal from the + component of the IMD signal. Op amp 410 applies this difference term to the gate of transistor M7. As with the embodiment of FIG. 3, op amp 410 may have its output coupled to its inverting and noninverting inputs through transistor M7. This may create a feedback structure to force the voltage at the inverting and noninverting inputs to be the same, thereby canceling the difference terms of the second-order IMD.

Figure 9:
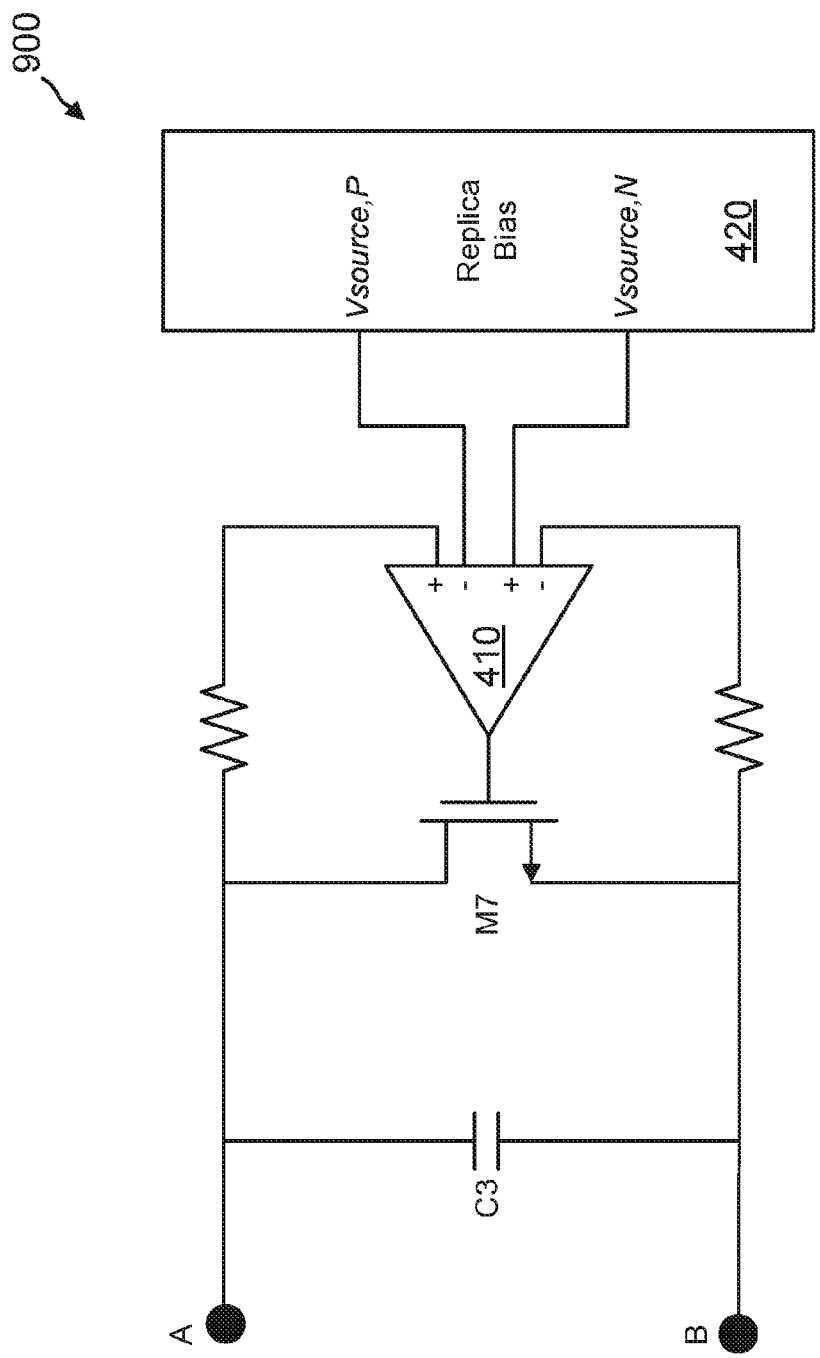
FIG. 9 is an illustration of an example IMD sink circuit, according to one embodiment.

FIG. 9 is an illustration of an example IMD sink circuit 900, according to one embodiment. FIG. 9 is provided to show that the embodiment of FIG. 4 may be implemented with M7 being an NMOS transistor by changing the polarity of the op amp 410.

Various embodiments may combine concepts from the embodiments of FIGS. 3 and 4. For instance, the embodiment of FIG. 4 may include a digital feedback loop at bias circuit 420, similar to that described above with respect to FIG. 3. Similarly, the embodiment of FIG. 3 may include a replica bias circuit (as in FIG. 10) rather than the digital feedback loop in some applications.

Figure 5:
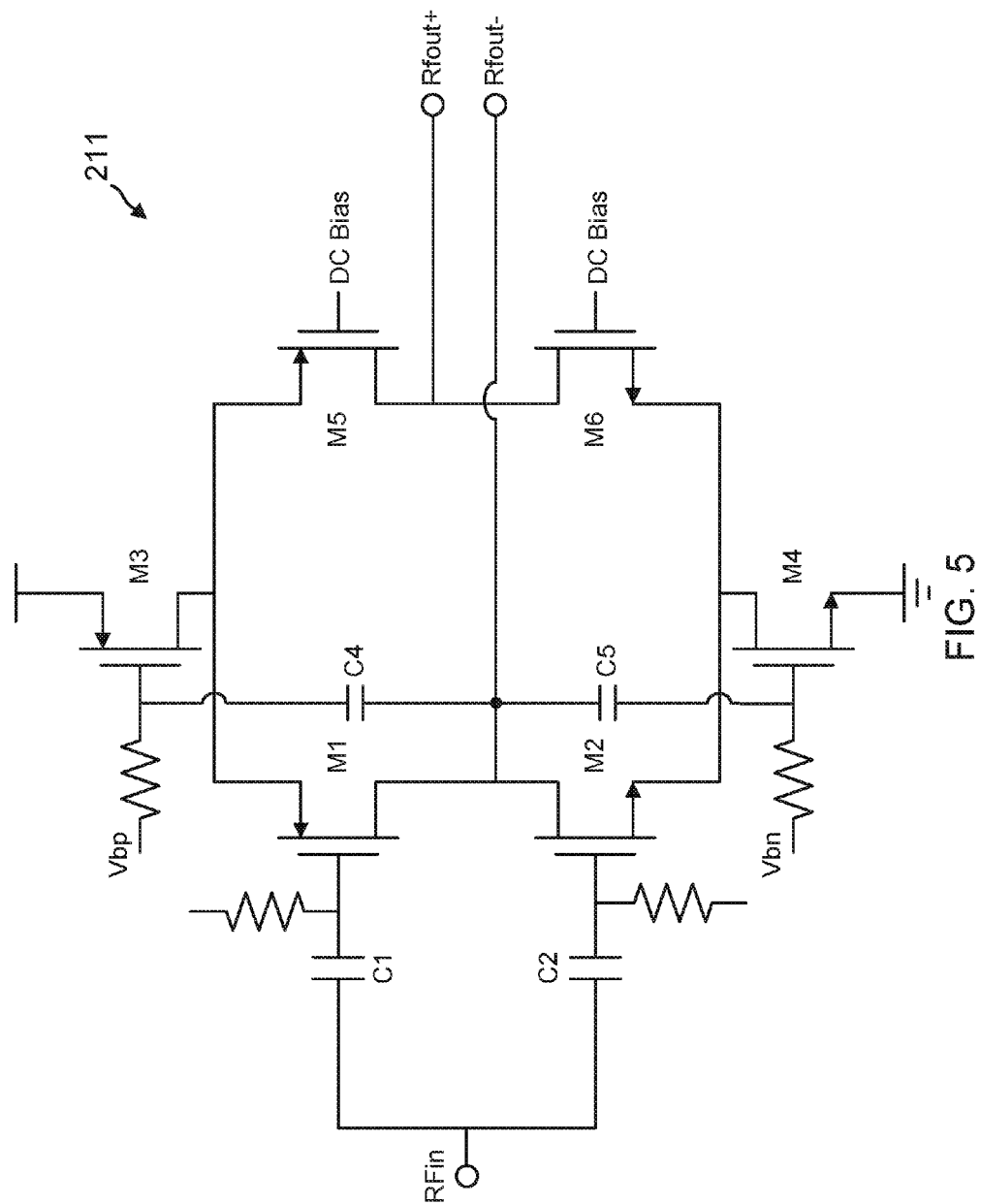
FIG. 5 illustrates an example active balun with a capacitive circuit for correcting for phase and amplitude imbalance, according to one embodiment.

Various embodiments may include further features to correct amplitude and phase of the resulting differential signal. FIG. 5 is an illustration of example active balun 211 with capacitors C4 and C5, adapted according to another embodiment. In the example of FIG. 5, IMD sink circuit 212 is omitted for ease of illustration, but it is understood that capacitors C4 and C5 may be implemented in addition to IMD sink circuit 212 and in some embodiments may be implemented in active balun 211 even if IMD sink circuit 212 were omitted.

The amplitude and phase of Rfout+ and Rfout− may be somewhat imbalanced due to a variety of different factors. One example factor includes distortion that is caused by resistive, capacitive, and inductive parasitics at the source nodes of transistors M1, M2, M5, and M6. Another example factor includes that M3 and M4 may not be perfect current sources, especially when exposed to the distortion from the resistive, capacitive, and inductive parasitics. FIG. 5 shows the active balun 211 with capacitors C4 and C5 coupled to the gates of transistors M3 and M4. Capacitors C4 and C5 add an AC current path that passes a portion of the signal at the operating frequency. The result is that the AC current path applies Rfout− to the gates of transistors M3 and M4 to increase or decrease the current through the transistors M3 and M4 in accordance with the amount of signal RFout− coupled to the gates of M3 and M4. Looking at transistor M3 first, its current will increase or decrease incrementally with the value of RFout−. Similarly, the current through M4 will increase or decrease incrementally with the value of RFout+, though opposite to that at M3 because of the difference between PMOS and NMOS devices. Thus, the AC current path causes M3 and M4 to adjust their currents in proportionally to RFout−.

In the example of FIG. 5, C4 and C5 may be selected to have a value that minimizes amplitude and phase distortion. For instance, simulation may be used during a design phase to determine appropriate values for the capacitance of C4 and C5 by applying multiple different capacitive values and choosing one or more values that provide a desirable cancellation of amplitude and phase imbalance. The addition of the AC current path provided by capacitors C4 and C5 may provide the advantage of increased precision with respect to amplitude and phase over active baluns not including such an AC current path.

Various embodiments may provide one or more advantages over conventional systems. For instance, the embodiments of FIGS. 1-4 may operate over a relatively larger band of frequencies than would a comparable circuit having a transformer because the embodiments of FIGS. 1-4 may use high-speed transistors rather than tuned LC components which may be narrowband around a center frequency. Also, some embodiments may omit the inductors associated with transformers, thereby being cheaper and more efficient to form on a semiconductor die than would a conventional transformer balun. Furthermore, the active balun may have much better reverse isolation than a passive LC implementation allowing its input to be connected to a single LNA in carrier aggregation architectures.

Additionally, the embodiments of FIGS. 1-4 may provide better performance with respect to even-order and odd-order IMD, thereby allowing for greater integrity of the differential signal. Furthermore, various embodiments may employ the AC current path of the embodiment of FIG. 5 to correct for amplitude and phase imbalance, thereby further increasing integrity of the differential signal. Signal receivers employing features described above may then experience higher signal quality at the inputs of downstream filters and analog to digital converters to provide better performance of the overall wireless device. In other words, various features described herein may allow for the use of relatively inexpensive and efficient transistor-based active baluns in systems having relatively tight distortion constraints.

Examples of applications that may employ features of the embodiments described herein include handheld devices, such as smart phones and tablet computers as well as fixed devices, such as wireless base stations and the like. In fact, any receiver employing an active balun may adopt features described herein to cancel or eliminate IMD and decrease amplitude and phase imbalance.

Figure 6:
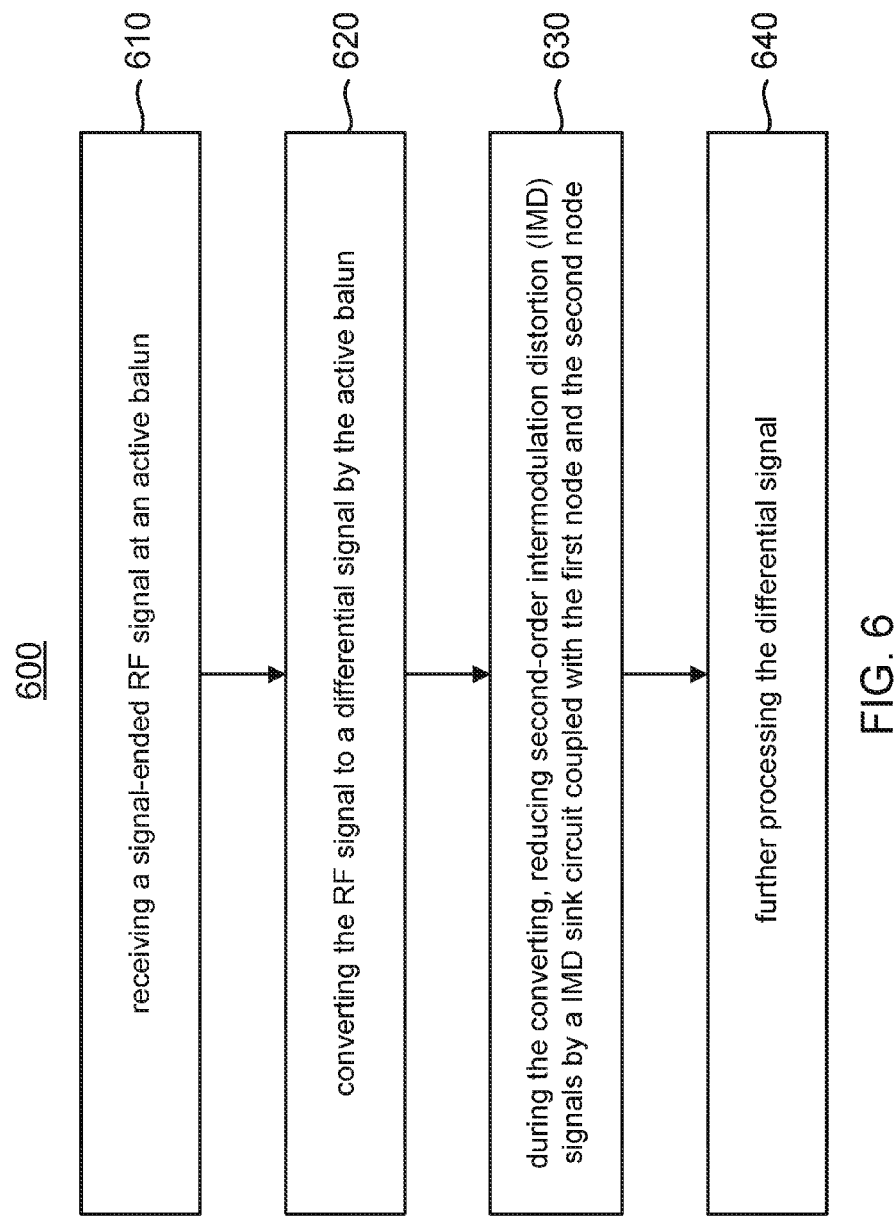
FIG. 6 illustrates an example method for operating an active balun, according to one embodiment.

Various embodiments may include methods to decrease IMD in active baluns. FIG. 6 illustrates example method 600, adapted according to various embodiments. Method 600 may be performed on any appropriate device including an active balun, such as the embodiments shown above with respect to FIGS. 1, 2, and 5. For instance, the active baluns of FIGS. 2 and 5 each include a first pair of complementary transistors (e.g., a PMOS transistor and an NMOS transistor) coupled in series between a first node and a second node (e.g., nodes A and B). The active baluns of FIGS. 2 and 5 also include a second pair of complementary transistors coupled in series between the first node and the second node. A third transistor (e.g., M3) may be coupled between a power source and the first node, and a fourth transistor (e.g., M4) may be coupled between the second node and ground. The third and fourth transistors act as a biasing current source for the active balun. The RF input may be coupled with the gates of the first and second transistors, thereby modulating current between the first node and the second node along the current path formed by the first and second transistors. A first differential signal output (e.g., Rfout−) may be located at a node at which the first and second transistors are coupled and a second differential signal output (Rfout+) may be located at a node at which the fifth (M5) and sixth (M6) transistors are coupled.

The second-order IMD signals appear at the first node and the second node during normal operation, wherein a firstly generated component of the IMD signal may be phase shifted from the secondly generated component of the IMD signal by about 180°. Accordingly, a firstly generated component of the IMD signal at the first node has an opposite polarity than does the secondly generated component of the IMD signal at the second node. An example IMD sink circuit, such as the embodiments shown in FIGS. 3 and 4, may be coupled to the first and second nodes and take advantage of the phase difference of the firstly and secondly generated IMD signal components.

Continuing with the example of the method 600, the balun receives a single-ended RF signal at action 610. An example is shown in FIG. 1, where the RF signal may be amplified by multiple stages of the LNAs before being received by the baluns themselves. Similarly, in FIGS. 2 and 5, the RF signal may be received and then applied to the gates of complementary transistors of the balun.

At action 620, the active balun converts the RF signal to a differential signal. An example is shown in FIGS. 2 and 5, where the differential signal outputs Rfout+ and Rfout− may be coupled to the drains of the transistors in the active balun. The differential signal includes two signal components offset by substantially 180°.

At action 630, the IMD sink circuit reduces second-order IMD signals. In the examples of FIGS. 2 and 5, the IMD signals appear at nodes A and B. The IMD signals include two components, a first component at node A and a second component shifted by substantially 180° and appearing at node B, such as illustrated in FIG. 7.

In some embodiments, action 630 includes shorting sum components of the IMD signals using a capacitor coupled with the first node and the second node. An example is shown in FIGS. 3 and 4 at capacitor C3. Such capacitor acts substantially as a short circuit to cancel out, or at least reduce, the sum terms of the IMD signals.

Some embodiments further reduce the difference terms of the IMD signals using active circuitry. The examples of FIGS. 3 and 4 use op amps to generate a difference signal from the first IMD component (+) and the second IMD component (−). In the example of action 630, the op amp outputs the difference signal to a transistor (e.g., M7), where the source and drain of the transistor are coupled with inverting and noninverting inputs of the op amp. The op amp is thus connected in a feedback architecture that forces signal values at its inverting and noninverting inputs to be substantially equal. This cancels, or at least reduces, the difference terms of the IMD signals while leaving the desired signal intact.

Such embodiments may further use one or more techniques to compensate for a DC bias of the active balun itself. For instance, the embodiment of FIG. 3 uses a bias circuit to compensate for the DC bias, where the bias circuit may be isolated from nodes A and B by one or more resistors. In another instance, the embodiment of FIG. 4 uses a replica bias generator to provide the DC bias voltage to inputs of the op amp, thereby allowing the op amp to compare the IMD signals. The DC bias of the active balun may be applied by the current sources (e.g., transistors M3 and M4).

Action 640 includes further processing the differential signal. This may include, e.g., converting a current signal to a voltage signal, further amplification, filtering, analog to digital conversion, and the like.

The scope of embodiments is not limited to the specific actions shown in FIG. 6. Rather, some embodiments may add, omit, modify, or rearrange the actions of method 600. For instance, while method 600 is shown as a series of discrete steps, it is understood that actions 610-640 may be performed continuously as the RF signal is received so that the actions may be simultaneous or overlapping in time.

Figure 11:
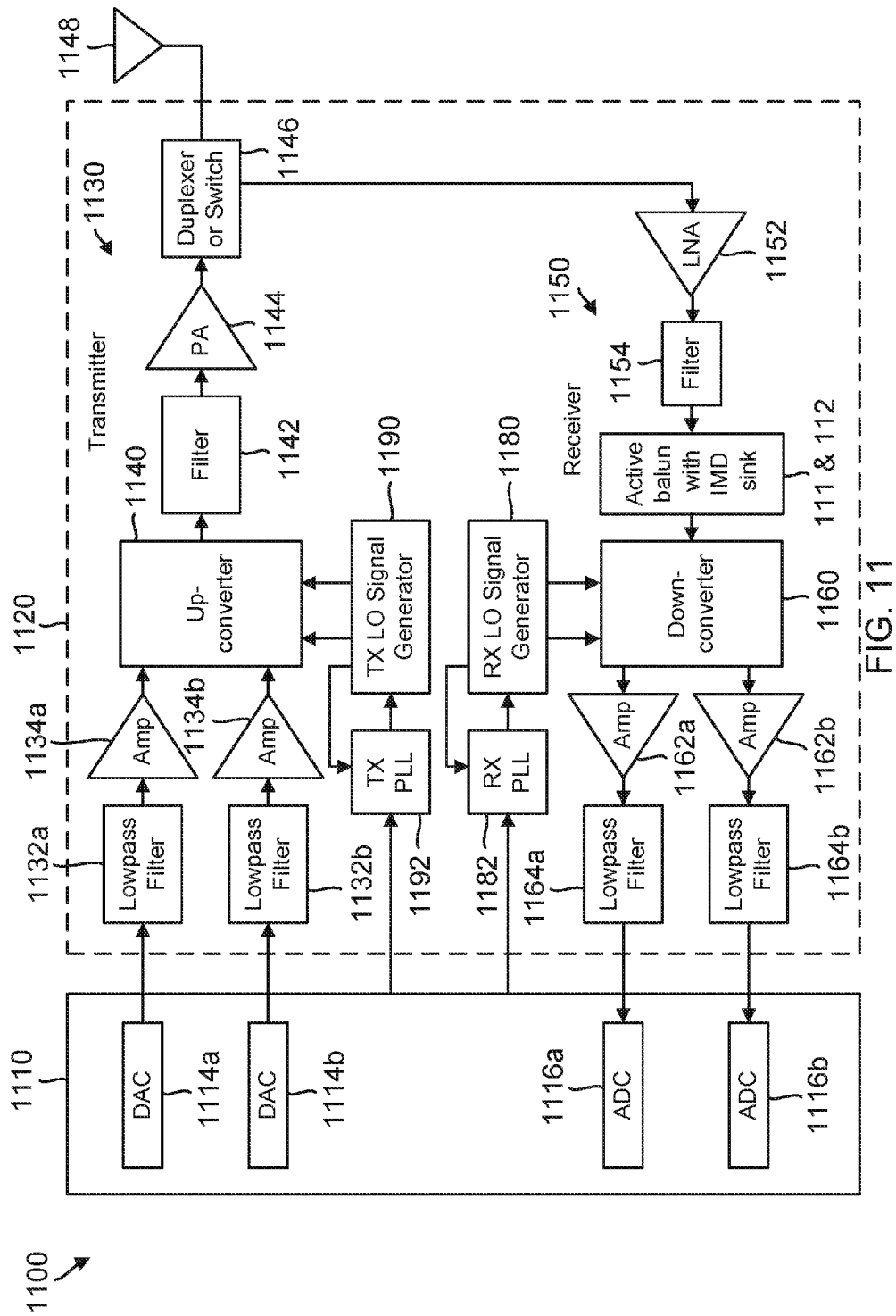
FIG. 11 is an illustration of an example wireless system, according to one embodiment.

FIG. 11 illustrates a wireless system including an IMD sink according to an embodiment. Specifically, in some embodiments an IMD sink and active balun such as described above with respect to FIGS. 1-5 and 8-10, may be implemented in wireless system 1100.

Wireless system 1100 may include baseband circuits 1110 for sending, receiving, and processing baseband digital signals to and from a transceiver 1120. Transceiver 1120 sends and receives RF communication signals to and from and antenna 1148. Digital communication signals are converted to analog signals in DACs 1114a-b and coupled to a transmit channel 1130, where "a" and "b" channels may correspond to "I" and "Q" components of the signal. The analog signals are low pass filtered (blocks 1132a-b), amplified (blocks 1134a-b), and upconverted (block 1140) using a local oscillator (LO) signal from a transmit (TX) phase locked loop (PLL) 1192 and a TX LO signal generator 1190. The upconverted signal is filtered (block 1142) and coupled to a power amplifier 1144. Power amplifier (PA) 1144 may include circuits for generating an envelope tracking signal from the input signal envelope and may include circuitry described herein for dividing power of the input signal and coupling multiple output signals to different stages of the power amplifier, for example. PA 1144 may further include a Doherty power amplifier as described above, for example. The output of PA 1144 is coupled through a duplexer or switch 1146 to an antenna for broadcasting the RF signals.

Transceiver 1120 further includes a receive channel (or receiver) 1150 including a low noise amplifier (LNA) 1152 for receiving signals from antenna 1148. The output of LNA 1152 is filtered (block 1154) and downconverted (block 1160) using an LO signal from a receiver (RX) phase locked loop (PLL) 1182 and a RX LO signal generator 1180, for example. In this embodiment, active balun 111 and IMD sink 112 are disposed between filter 1154 and downconverter 1160. The downconverted signals are amplified (blocks 1162a-b), filtered (blocks 1164a-b) and coupled to ADCs 1116a-b in the baseband circuits 1110 for conversion to the digital domain for further signal processing. Wireless system 1100 may be included in a smartphone, tablet computer, or other device. Wireless system 1100 may also perform the actions of FIG. 6.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
   an active balun having an RF signal input and having differential signal outputs, the active balun including a first pair of transistors coupled to the RF signal input, the first pair of transistors including a first transistor of a first type and a second transistor of a second type, wherein the first type and second type are complementary; and
   an intermodulation distortion (IMD) sink circuit comprising an operational amplifier (op amp) coupled between a first node and a second node, wherein the first transistor and second transistor are coupled in series between the first node and the second node.

2. The circuit of claim 1, wherein the IMD sink circuit includes a bias circuit configured to remove a DC bias of the active balun.

3. The circuit of claim 1, wherein the IMD sink circuit includes a capacitor coupled with the first node and the second node and the op amp coupled with the first node and the second node, the op amp having an output controlling a gate of a transistor coupled with the first node and the second node.

4. The circuit of claim 1, wherein the IMD sink circuit includes the op amp coupled with the first node and the second node, the op amp having an output controlling a gate of a transistor coupled with the first node and the second node, the op amp having a first input coupled with the first node, a second input coupled with the second node, and a third and fourth input coupled with bias voltages of the active balun.

5. The circuit of claim 1, further comprising a first capacitor and a second capacitor coupling a first one of the differential signal outputs with gates of transistors of a biasing current source in series with the first pair of transistors.

6. The circuit of claim 1, wherein the active balun includes a second pair of transistors having a third transistor of the first type and a fourth transistor of the second type, the second pair of transistors being coupled with a biasing current source.

7. The circuit of claim 6, wherein a first one of the differential signal outputs is coupled with drains of the first and second transistors, and wherein a second one of the differential signal outputs is coupled with drains of the third and fourth transistors.

8. The circuit of claim 1, wherein the first type comprises p-channel MOSFET (PMOS), and the second type comprises n-channel MOSFET (NMOS).

9. The circuit of claim 1, wherein the RF signal input is coupled with a gate of the first transistor and a gate of the second transistor, and wherein a first one of the differential signal outputs is coupled with drains of the first and second transistors.

10. The circuit of claim 1, wherein the first and second transistors are coupled in series with a biasing current source, the biasing current source comprising:
   a third transistor of the first type having a drain coupled to a source of the first transistor; and
   a fourth transistor of the second type having a drain coupled to a source of the second transistor.

11. A method comprising:
   receiving a single-ended RF signal at an active balun, the active balun including a first transistor of a first type and a second transistor of a second type coupled in series between a first node and a second node, the first type and second type being complementary, wherein the single-ended RF signal is received at a gate of the first transistor and at a gate of the second transistor;
   converting the single-ended RF signal to a differential signal by the active balun; and
   during the converting, reducing second-order intermodulation distortion (IMD) signals by a IMD sink circuit coupled with the first node and the second node.

12. The method of claim 11, further comprising:
   applying a DC bias to the active balun by a third transistor coupled with the first node and a power supply and a fourth transistor coupled with the second node and ground; and
   coupling a first component of the differential signal to a gate of the third transistor and to a gate of the fourth transistor.

13. The method of claim 11, wherein reducing second-order IMD signals comprises:
   shorting sum components of the second-order IMD signals by a capacitor coupled with the first node and the second node.

14. The method of claim 11, wherein reducing second-order IMD signals comprises:
   generating a difference signal by an operational amplifier (op amp) coupled with the first node and the second node; and
   applying the difference signal to a gate of a third transistor coupled with the first node and the second node.

15. The method of claim 11, wherein the second-order IMD signals comprise a first component at the first node and a second component shifted by 180° from the first component and at the second node, wherein reducing second-order IMD signals comprises:
   generating a difference signal by an operational amplifier (op amp) coupled with the first component and the second component; and
   applying the difference signal to a gate of a third transistor coupled with the first node and the second node.

16. The method of claim 11, wherein reducing second-order IMD signals comprises:
   applying a bias voltage of the active balun to a first input and a second input of an operational amplifier (op amp);
   coupling the first node and the second node to third and fourth inputs of the op amp; and
   generating a difference signal by the op amp and applying the difference signal to a gate of a third transistor coupled with the first node and the second node.

17. The method of claim 11, wherein the first type comprises p-channel MOSFET (PMOS), and the second type comprises n-channel MOSFET (NMOS).

18. The method of claim 11, wherein the active balun further comprises a third transistor of the first type and a fourth transistor of the second type coupled in series between the first node and the second node, the method further comprising:
   outputting a first component of the differential signal at a node coupling drains of the first and second transistors; and
   outputting a second component of the differential signal at a node coupling drains of the third and fourth transistors.

19. A radio frequency (RF) receiver comprising:
   means for converting a single-ended RF signal to a differential signal, wherein the means for converting include a first transistor of a first type and a second transistor of a second type coupled in series with a first node and a second node, the first and second types being complementary; and
   means for reducing intermodulation distortion (IMD) signals at the first node and the second node.

20. The RF receiver of claim 19 wherein the first type comprises p-channel MOSFET (PMOS), and the second type comprises n-channel MOSFET (NMOS).

21. The RF receiver of claim 19, wherein the means for converting further comprise:
   a third transistor of the first type and a fourth transistor of the second type coupled in series with the first node and the second node; and
   means for generating a bias current for the means for converting, the means for generating the bias current being coupled with the first node and a power supply and with the second node and ground.

22. The RF receiver of claim 19, wherein the means for reducing IMD signals comprises:
   means for causing a short circuit between the first node and the second node with respect to sum components of the IMD signals.

23. The RF receiver of claim 19, wherein the means for reducing IMD signals comprises:
   means for receiving a signal at the first node and at the second node and generating a difference signal in response to a difference term of the IMD signals; and
   a third transistor receiving the difference signal at its gate, the third transistor coupling the first node and the second node.

24. The RF receiver of claim 19, wherein the means for reducing IMD signals comprises:
   means for canceling a DC bias of the means for converting, the means for canceling being coupled with inputs of an operational amplifier (op amp) receiving a first component of the IMD signals and a second component of the IMD signals phase shifted by 180° from the first component of the IMD signals;
   wherein the means for canceling includes means for receiving a feedback signal from a modem of the RF receiver and means for adjusting an output DC signal to reduce the IMD signals in the feedback signal.

25. The RF receiver of claim 19, further comprising:
   means for generating a bias current for the means for converting, the means for generating the bias current including a third transistor coupled with the first node and a power supply and a fourth transistor coupled with the second node and ground; and
   means for applying current from a component of the differential signal to a gate of the third transistor and to a gate of the fourth transistor.

26. A circuit comprising:
an active balun including:
   a first transistor of a first type and a second transistor of a second type coupled in series between a first node and a second node, the first type and the second type being complementary;
   a third transistor of the first type and a fourth transistor of the second type coupled in series between the first node and the second node;
   a first current source coupled between the first node and a power supply;
   a second current source coupled between the second node and ground;
   a radio frequency (RF) input configured to receive an RF signal at a gate of the first transistor and at a gate of the second transistor;
   a first differential signal output coupled to a drain of the first transistor and a drain of the second transistor; and
   a second differential signal output coupled to a drain of the third transistor and a drain of the fourth transistor; and
an intermodulation distortion (IMD) sink circuit coupled with the active balun and comprising:
   a first capacitor coupled with the first node and the second node; and
   an operational amplifier (op amp) configured to receive a first component of an IMD signal and a second component of the IMD signal and to generate a difference signal in response thereto.

27. The circuit of claim 26, wherein the first type comprises p-channel MOSFET (PMOS), and the second type comprises n-channel MOSFET (NMOS).

28. The circuit of claim 26, further comprising:
an AC current path coupled with a gate of the first current source and with a gate of the second current source.

29. The circuit of claim 28, wherein the AC current path comprises:
   a first capacitor coupled with the gate of the first current source and with the first differential signal output; and
   a second capacitor coupled with the gate of the second current source and with the first differential signal output.

* * * * *